(12) United States Patent
Choi et al.

(10) Patent No.: US 11,056,473 B2
(45) Date of Patent: Jul. 6, 2021

(54) MICRO LIGHT SOURCE ARRAY, DISPLAY DEVICE HAVING THE SAME, AND METHOD OF MANUFACTURING DISPLAY DEVICE

(71) Applicants: SAMSUNG ELECTRONICS CO., LTD., Suwon-si (KR); SEOUL NATIONAL UNIVERSITY R&DB FOUNDATION, Seoul (KR)

(72) Inventors: Junhee Choi, Seongnam-si (KR); Euijoon Yoon, Seoul (KR)

(73) Assignees: SAMSUNG ELECTRONICS CO., LTD., Suwon-si (KR); SEOUL NATIONAL UNIVERSITY R&DB FOUNDATION, Seoul (KR)

( * ) Notice: Subject to any disclaimer, the term of this patent is extended or adjusted under 35 U.S.C. 154(b) by 0 days.

(21) Appl. No.: 16/670,457

(22) Filed: Oct. 31, 2019

(65) Prior Publication Data
US 2020/0168594 A1    May 28, 2020

(30) Foreign Application Priority Data
Nov. 27, 2018  (KR) .......................... 10-2018-0148546

(51) Int. Cl.
| | |
|---|---|
| *H01L 33/50* | (2010.01) |
| *H01L 33/48* | (2010.01) |
| *H01L 25/16* | (2006.01) |
| *H01L 27/12* | (2006.01) |

(52) U.S. Cl.
CPC ........ *H01L 25/167* (2013.01); *H01L 27/1214* (2013.01); *H01L 33/486* (2013.01); *H01L 33/50* (2013.01); *H01L 2933/0033* (2013.01)

(58) Field of Classification Search
None
See application file for complete search history.

(56) References Cited

U.S. PATENT DOCUMENTS

| | | | |
|---|---|---|---|
| 6,892,450 B2 | 5/2005 | Ohba et al. | |
| 9,349,911 B2 | 5/2016 | Lau et al. | |
| 2018/0033853 A1 | 2/2018 | Bower et al. | |
| 2018/0041005 A1* | 2/2018 | Bower ...................... | H01S 5/32 |
| 2018/0331085 A1 | 11/2018 | Chang et al. | |
| 2020/0321390 A1* | 10/2020 | Wu ..................... | H01L 33/0093 |

FOREIGN PATENT DOCUMENTS

| | | | |
|---|---|---|---|
| JP | 5813636 B2 | 11/2015 | |
| KR | 10-2018-0009116 A | 1/2018 | |

\* cited by examiner

*Primary Examiner* — Bilkis Jahan
(74) *Attorney, Agent, or Firm* — Sughrue Mion, PLLC

(57) ABSTRACT

Provided are a micro light source array for a display device, a display device including the micro light source array, and a method of manufacturing the display device. The micro light source array includes: a plurality of silicon sub-mounts provided on a substrate, each silicon sub-mount from among the plurality of silicon sub-mounts corresponding to a respective sub-pixel from among a plurality of sub-pixels of a display device, the plurality of silicon sub-mounts being separated from each other by a plurality of trenches; a plurality of light emitting device chips coupled to the plurality of silicon sub-mounts; and a plurality of driving circuits provided at the plurality of silicon sub-mounts.

6 Claims, 22 Drawing Sheets

MICRO LIGHT SOURCE ARRAY, DISPLAY DEVICE HAVING THE SAME, AND METHOD OF MANUFACTURING DISPLAY DEVICE

CROSS-REFERENCE TO RELATED APPLICATION

This application claims priority to Korean Patent Application No. 10-2018-0148546, filed on Nov. 27, 2018, in the Korean Intellectual Property Office, the disclosure of which is incorporated by reference herein in its entirety.

BACKGROUND

1. Field

Example embodiments of the present disclosure relates to a micro light source array, a display device including the micro light source array, and a method of manufacturing the display device.

2. Description of Related Art

Light emitting diodes (LEDs) have the advantages of low power consumption and environmental friendliness. Owing to these advantages, industrial demand for LEDs has increased. LEDs are applied not only to lighting devices and LCD backlights, but also to LED display devices. That is, display devices using micro-sized LED chips have been developed. When manufacturing micro LED display devices, it is necessary to transfer micro LEDs to a substrate. A pick-and-place method has been widely used as a method of transferring micro LEDs. However, this method decreases productivity as the size of micro LEDs decreases and the size of display devices increases.

SUMMARY

Example embodiments provide micro light source arrays arranged on silicon sub-mounts.

Further, example embodiments provide display devices including micro light source arrays arranged on silicon sub-mounts.

Further still, example embodiments provide methods of manufacturing display devices.

Additional aspects will be set forth in part in the description which follows and, in part, will be apparent from the description, or may be learned by practice of the presented embodiments.

In accordance with an aspect of an example embodiment, there is provided a micro light source array for a display device, the micro light source array including: a plurality of silicon sub-mounts provided on a substrate, each silicon sub-mount from among the plurality of silicon sub-mounts corresponding to a respective sub-pixel from among a plurality of sub-pixels of the display device, the plurality of silicon sub-mounts being separated from each other by a plurality of trenches; a plurality of light emitting device chips coupled to the plurality of silicon sub-mounts; and a plurality of driving circuits provided at the plurality of silicon sub-mounts.

Each driving circuit from among the plurality of driving circuits may include a complementary metal-oxide semiconductor (CMOS) or a n-channel metal-oxide semiconductor (NMOS).

The micro light source array may further include wiring electrically connected to the plurality of silicon sub-mounts.

The plurality of light emitting device chips may be flip-chip bonded to the plurality of silicon sub-mounts.

A pitch between adjacent silicon sub-mounts from among the plurality of silicon sub-mounts in each of a first direction and a second direction perpendicular to the first direction may be equal to a pitch between adjacent sub-pixels from among the plurality of sub-pixels.

Each light emitting device chip from among the plurality of light emitting device chips may include a respective micro light emitting diode (LED).

The plurality of light emitting device chips may be configured to emit blue light.

In accordance with an aspect of another example embodiment there is provided, a display device including: a substrate; a plurality of silicon sub-mounts provided on the substrate, each silicon sub-mount from among the plurality of silicon sub-mounts corresponding to a respective sub-pixel from among a plurality of sub-pixels of the display device, the plurality of silicon sub-mounts being separated from each other by a plurality of trenches; a plurality of light emitting device chips coupled to the plurality of silicon sub-mounts; a plurality of driving circuits provided at the plurality of silicon sub-mounts; and a plurality of color conversion devices provided on the plurality of light emitting device chips, the plurality of color conversion devices being configured to convert a color of light emitted from the plurality of light emitting device chips.

Each driving circuit from among the plurality of driving circuits may include a respective CMOS or a respective NMOS.

The plurality of light emitting device chips may be flip-chip bonded to the plurality of silicon sub-mounts.

A pitch between adjacent silicon sub-mounts from among the plurality of silicon sub-mounts in each of a first direction and a second direction perpendicular to the first direction may be equal to a pitch between adjacent sub-pixels from among the plurality of sub-pixels.

Each light emitting device chip from among the plurality of light emitting device chips may include a respective micro LED.

The plurality of light emitting device chips may be configured to emit blue light.

In accordance with an aspect of another example embodiment, there is provided a method of manufacturing a display device, the method including forming a plurality of driving circuits on a silicon substrate; forming a plurality of trenches in the silicon substrate between the plurality of driving circuits; bonding a light emitting device array to the plurality of driving circuits; and polishing a rear side of the silicon substrate until the plurality of trenches penetrate the silicon substrate to form a plurality of separate silicon sub-mounts.

The method may further include transferring the plurality of separate silicon sub-mounts to a target substrate.

The method may further include spreading and arranging the plurality of separate silicon sub-mounts by inserting a moving device between adjacent separate silicon sub-mounts from among the plurality of separate silicon sub-mounts and moving the moving device in a first direction.

The method may further include spreading and arranging the plurality of separate silicon sub-mounts by inserting the moving device between the adjacent separate silicon sub-mounts from among the plurality of separate silicon sub-mounts and moving the moving device in a second direction perpendicular to the first direction.

The method may further include inserting a moving device between adjacent separate silicon sub-mounts from among the plurality of separate silicon sub-mounts and moving the moving device in a first direction to space the adjacent separate silicon sub-mounts apart from each other.

The method may further include inserting the moving device between the adjacent separate silicon sub-mounts from among the plurality of separate silicon sub-mounts which are spaced apart from each other in the first direction and moving the moving device in a second direction perpendicular to the first direction to move the plurality of separate silicon sub-mounts along a plurality of grooves.

The plurality of grooves may include a region in which an interval between adjacent grooves from among the plurality of grooves increases.

The moving device may have a wedge shape, and the method may further include spreading the plurality of separate silicon sub-mounts by inserting and moving the moving device between the adjacent separate silicon sub-mounts from among the plurality of separate silicon sub-mounts.

The moving device may include a first portion configured to enter between the adjacent separate silicon sub-mounts from among the plurality of separate silicon sub-mounts; and a second portion configured to adjust an interval between the adjacent separate silicon sub-mounts from among the plurality of separate silicon sub-mounts, wherein a pitch between the adjacent separate silicon sub-mounts from among the plurality of separate silicon sub-mounts is determined according to a width of the second portion.

BRIEF DESCRIPTION OF THE DRAWINGS

The above and/or other aspects will be more apparent and more readily appreciated from the following description of example embodiments, taken in conjunction with the accompanying drawings, in which.

DETAILED DESCRIPTION

Figure 1:
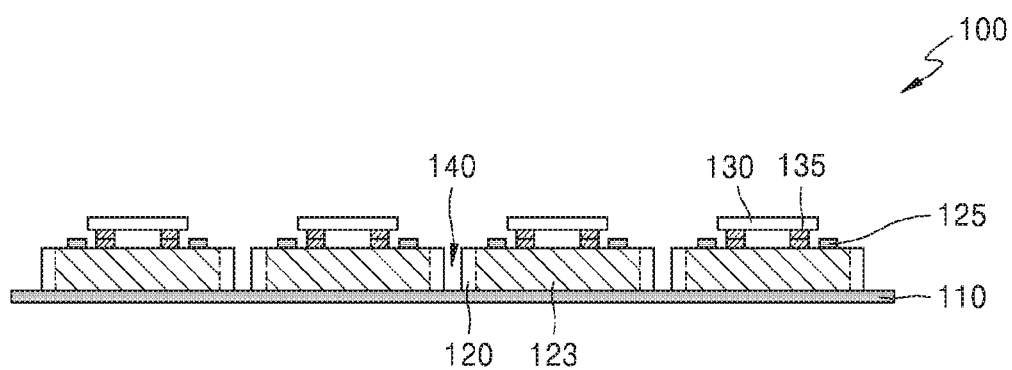
FIG. 1 is a view illustrating a micro light source array according to an example embodiment.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. As used herein, the term "and/or" includes any and all combinations of one or more of the associated listed items. Expressions such as "at least one of," when preceding a list of elements, modify the entire list of elements and do not modify the individual elements of the list.

Hereinafter, micro light source arrays, display devices including the micro light source arrays, and methods of manufacturing the display devices will be described according to various example embodiments with reference to the accompanying drawings. In the drawings, like reference numerals refer to like elements, and the sizes of elements may be exaggerated for clarity of illustration. It will be understood that although the terms "first," "second," etc. may be used herein to describe various elements, these elements should not be limited by these terms. These terms are only used to distinguish one element from another.

The terms of a singular form may include plural forms unless otherwise mentioned. It will be further understood that the terms "comprises", "comprising", "includes", and/or "including" used herein specify the presence of stated features or elements, but do not preclude the presence or addition of one or more other features or elements. In the drawings, the size or thickness of each element may be exaggerated for clarity of illustration. In addition, when a material layer is referred to as being "above" or "on" a substrate or another layer, it can be directly on the substrate or the other layer, or intervening layers may also be present. In the following description, a material of each layer is an example. That is, another material may be used.

FIG. 1 is a cross-sectional view illustrating a schematic structure of a micro light source array 100 according to an example embodiment.

The micro light source array 100 may be employed in a display device including a plurality of sub-pixels that are configured to be independently driven. In the display device, the sub-pixels may be units from which light having different colors is emitted. For example, the display device may include first sub-pixels configured to display red light, second sub-pixels configured to display green light, and third sub-pixels configured to display blue light. Every first to third sub-pixels may form one pixel. In other words, each pixel may include one first sub-pixel, one second sub-pixel, and one third sub-pixel. For example, the pixels may display color images by combinations of first to third sub-pixels. The micro light source array 100 may include silicon sub-mounts 120 (i.e., connection units) provided on a base 110 and corresponding to the sub-pixels, driving circuits 123 provided at the silicon sub-mounts 120, and light emitting device chips 130 coupled to the silicon sub-mounts 120. The silicon sub-mounts 120 may be provided on the base 110 in a grid pattern.

Trenches 140 may be provided between the silicon sub-mounts 120 neighboring each other (i.e., between adjacent silicon sub-mounts) such that the silicon sub-mounts 120 may be spaced apart from each other. The trenches 140 may be formed to expose the base 110 through the trenches 140. That is, the silicon sub-mounts 120 are separate parts spaced apart from each other. Electrodes 135 may be provided on the light emitting device chips 130. Each of the driving circuits 123 may include at least one transistor and at least one capacitor to drive the light emitting device chips 130. Each of the driving circuit 123 may include a complementary metal-oxide semiconductor (CMOS) or an n-channel metal-oxide semiconductor (NMOS). Contact pads 125 corresponding to the driving circuits 123 may be provided. The driving circuits 123 may be manufactured through a semiconductor process. In an example embodiment, for example, the light emitting device chips 130 may be light sources configured to emit blue light. The display device may include color conversion devices configured to convert blue light emitted from the light emitting device chips 130 such that the display device may display color images. This will be described later.

The base 110 may be a target substrate of the display device in which the micro light source array 100 is employed. For example, the base 110 may be a substrate for a backplane of the display device, or a support plate for fixing micro light sources. Alternatively, the base 110 may be a movable part for transferring micro light sources to a target substrate. The base 110 may be applied to various other devices.

Figure 2:
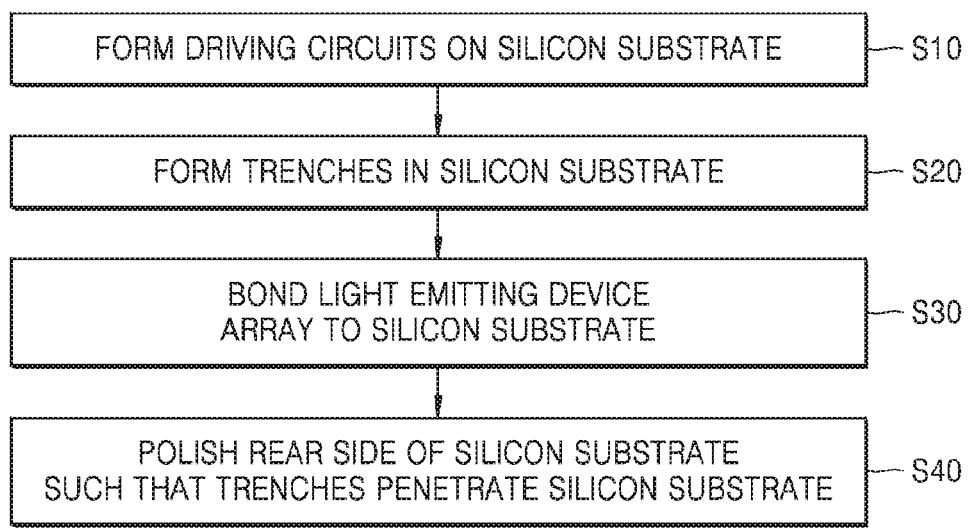
FIG. 2 is a view illustrating a method of transferring micro light sources according to an example embodiment.

FIG. 2 illustrates a method of manufacturing a micro light source array according to an example embodiment.

Figure 3:
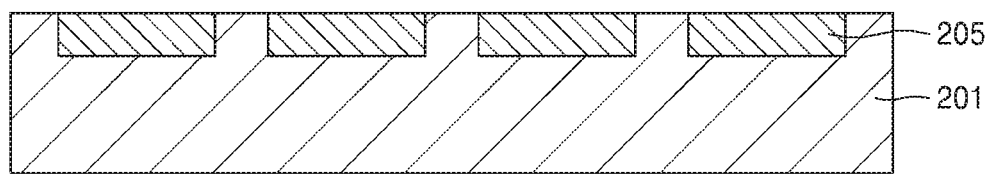
FIGS. 3 to 12 are views illustrating a method of manufacturing a micro light source array according to an example embodiment.

Driving circuits may be formed on a silicon substrate through a semiconductor process (S10) (as shown, for example, in FIG. 3). The driving circuits may be configured to drive light emitting device chips as described above. Thereafter, trenches may be formed in the silicon substrate (S20) (as shown, for example, in FIG. 5). Here, the trenches may be formed to a given depth such that the trenches may not penetrate the silicon substrate. A light emitting device array in which light emitting device chips are arranged is bonded to the silicon substrate (S30) (as shown, for example, in FIG. 9). Thereafter, a rear side of the silicon substrate is polished such that the trenches may penetrate the silicon substrate (S40) (as shown, for example, in FIG. 11).

Hereinafter, an example method of manufacturing a micro light source array will be described. Referring to FIG. 3, driving circuits 205 may be formed in a silicon substrate 201. Each of the driving circuits 205 may include, for example, at least one transistor and at least one capacitor. Alternatively, each of the driving circuits 205 may include a complementary metal-oxide semiconductor (CMOS) or an n-channel metal-oxide semiconductor (NMOS). The driving circuits 205 may be manufactured through a semiconductor process.

Figure 4:
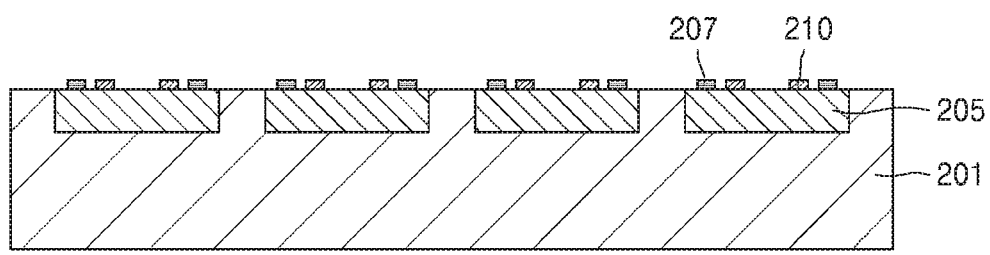

Referring to FIG. 4, contact pads 207 corresponding to the driving circuits 205 may be provided. The contact pads 207 may be connected to an active matrix circuit for a display device to be described later. The contact pads 207 may include one or more layers and may include various conductive materials including, for example, metals, conductive oxides, and conductive polymers.

In addition, the driving circuits 205 may be provided with bonding pads 210. The bonding pads 210 may be provided to connect micro light sources to the driving circuits 205 (described later).

Figure 5:
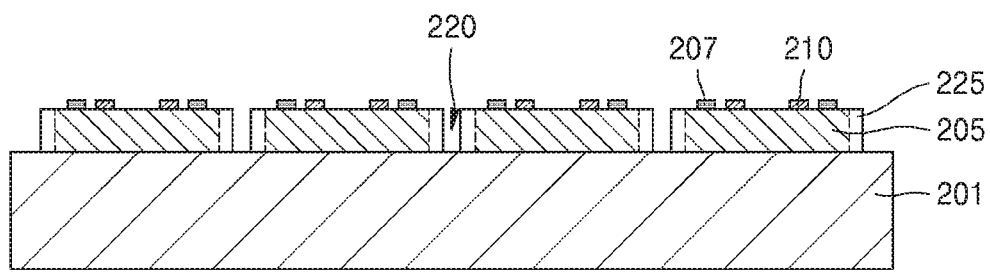

Referring to FIG. 5, trenches 220 may be formed in the silicon substrate 201. The trenches 220 may be formed, for example, through a deep reactive ion etching (RIE) process. The formation of the trenches 220 may cause silicon sub-mounts 225 to be formed spaced apart from each other. The depth of the trenches 220 may determine the thickness of the silicon sub-mounts 225. For example, the trenches 220 may have a depth of about 20 μm or less.

Figure 6:
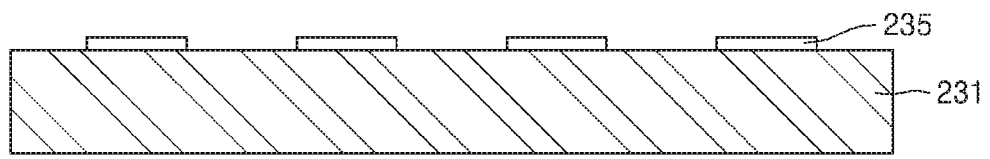

Referring to FIG. 6, light emitting device chips 235 may be formed on a substrate 231. Each of the light emitting device chips 235 may include a plurality of layers. The light emitting device chips 235 may include, for example, an undoped GaN/n-GaN/multi quantum well (MQW)/p-GnN layer. However, this is only an embodiment, and various other embodiments are possible. For example, the substrate 231 may include at least one of sapphire, SiC, Si, GaAs, GaN, ZnO, Si, GaP, InP, Ge and $Ga_2O_3$. The light emitting device chips 235 may all have the same structure for emitting one-color light. The light emitting device chips 235 may be, for example, light emitting diodes (LEDs) that emit blue light. As described above, when each of the light emitting device chips 235 is constituted by a single chip configured to emit one-color light, the yield of the light emitting device chips 235 may be increased, and the efficiency of transferring micro light sources may be increased. In comparison, to use light emitting device chips configured to emit multicolor light, light emitting device chips configured to emit light of different colors are individually manufactured, thereby complicating the manufacturing process of the light emitting device chips. In addition, when light emitting device chips configured to emit light of different colors are transferred, the transferring process is performed separately for each color light, and thus transfer efficiency is lowered. Furthermore, in the case of using light emitting device chips configured to emit light of different colors, the light emitting device chips may have different sizes according to the color of light emitted, and thus when the light emitting device chips are transferred, it may be difficult to adjust the pitch between the light emitting device chips. In contrast, in the case of using the light emitting device chips 235 configured to emit one-color light, the light emitting device chips 235 may be transferred through a simple process.

Figure 7:
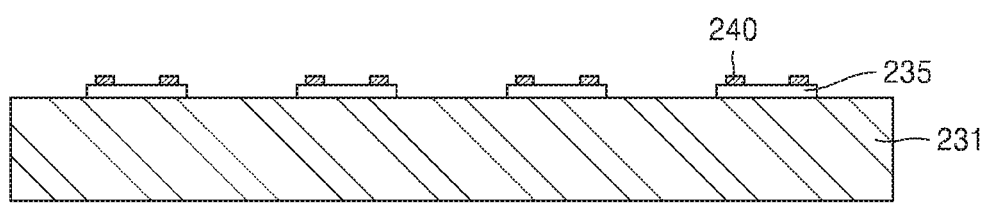

Referring to FIG. 7, electrodes 240 may be formed on the light emitting device chips 235. The electrodes 240 may include a metal such as aluminum, molybdenum, titanium, tungsten, silver, gold, or an alloy thereof. Alternatively, the electrodes 240 may include a transparent conductive layer including a transparent material, for example, a transparent conductive oxide (TCO) such as ITO, IZO, ZnO, or $In_2O_3$, a carbon nanotube film, or a transparent conductive polymer.

Figure 8:
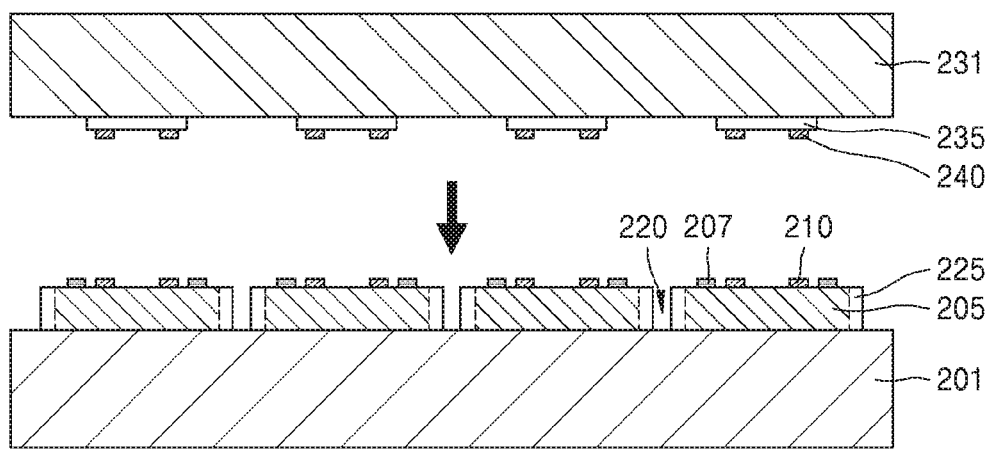

Referring to FIG. 8, the substrate 231 may be turned over to align the light emitting device chips 235 with the silicon sub-mounts 225 shown in FIG. 5. In addition, the light emitting device chips 235 and the silicon sub-mounts 225 may be coupled to each other. For example, each light emitting device chip 225 may be coupled to a respective silicon sub-mount 225. For example, the light emitting device chips 235 and the silicon sub-mounts 225 may be flip-chip bonded to each other.

Figure 9:
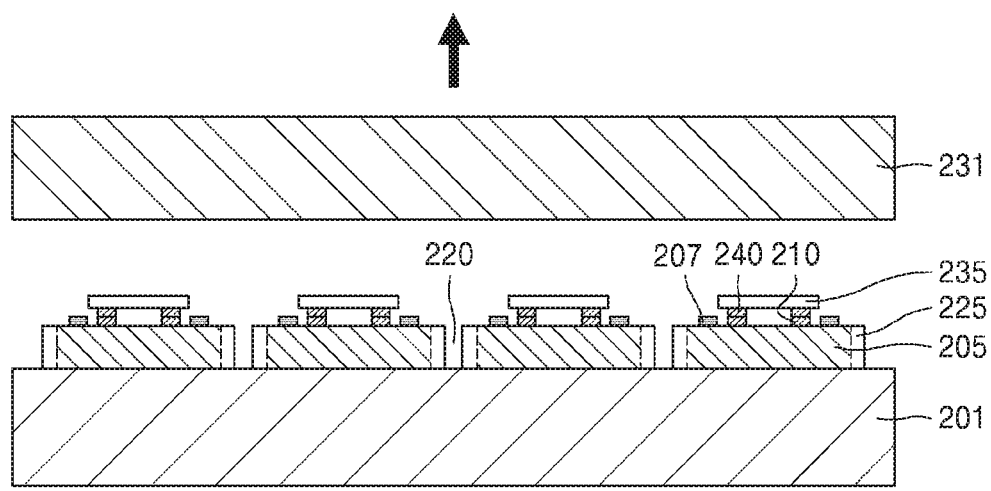

Referring to FIG. 9, after the light emitting device chips 225 are coupled to the silicon sub-mounts 225, the substrate 231 is removed from the light emitting device chips 235. The substrate 231 may be removed by a laser lift-off method or a mechanical lift-off method.

Figure 10:
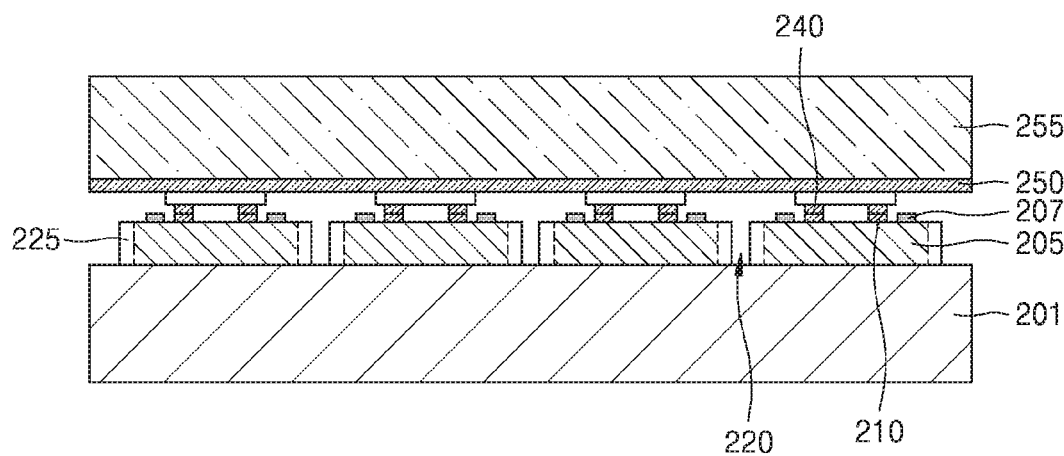
Figure 11:
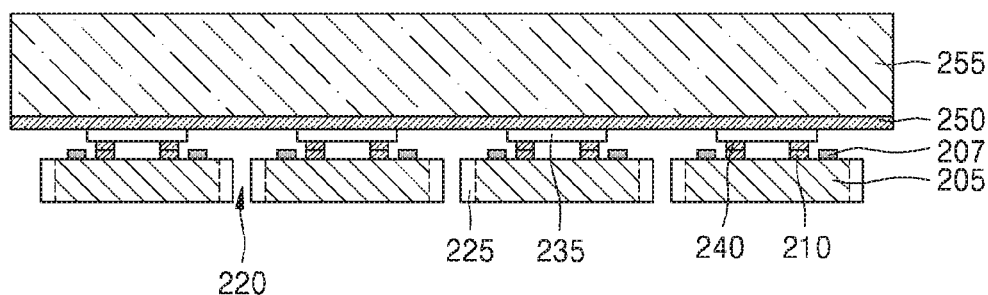
Figure 12:
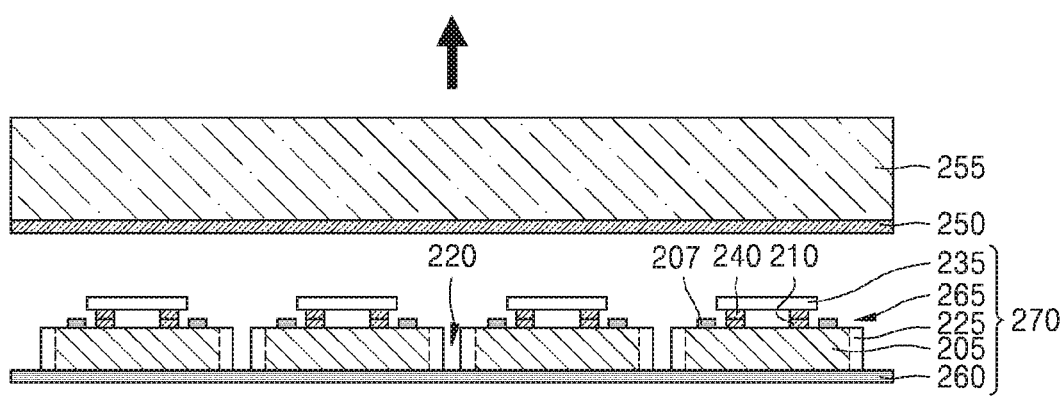

Thereafter, as shown in FIG. 10, a handling wafer 255 provided with an adhesive layer 250 may be attached to the light emitting device chips 235 shown in FIG. 9. In addition, as shown in FIG. 11, a rear side of the silicon substrate 201 may be polished such that the trenches 220 may penetrate the silicon substrate 201. As a result, the silicon sub-mounts 225 may be separated from each other. Referring to FIG. 12, after the silicon sub-mounts 225 are separated from each other, the silicon sub-mounts 225 may be coupled to tape 260, and then the handling wafer 255 may be removed. The tape 260 may include a material such that the tape 260 may fix and support the arrangement of the silicon sub-mounts 225 to prevent scattering of the silicon sub-mounts 225 and may be easily removed if necessary. In the present example embodiment, the silicon sub-mounts 225 and the light emitting device chips 235 corresponding to the silicon sub-mounts 225 may constitute micro light sources 265. In this manner, a micro light source array 270 may be manufactured as shown in FIG. 12.

Figure 13:
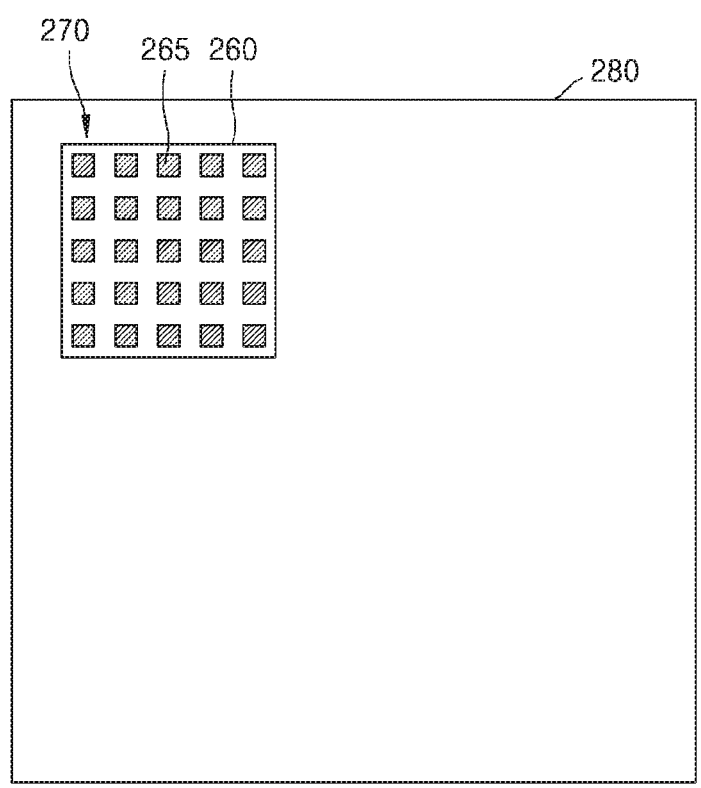
FIGS. 13 to 16 are views illustrating a method of transferring micro light sources according to an example embodiment.

Referring to FIG. 13, the micro light source array 270 may be transferred to a base 280. The micro light source array 270 may be entirely transferred to the base 280 in a state in which the micro light source array 270 is attached to the tape 260. The base 280 may be a target substrate for mounting the micro light source array 270 thereon. In this manner, the micro light source array 270 may be entirely transferred to the base 280, and the micro light sources 265 may then be spread or spaced apart at given intervals. Various methods may be used to spread the micro light sources 265.

Figure 14:
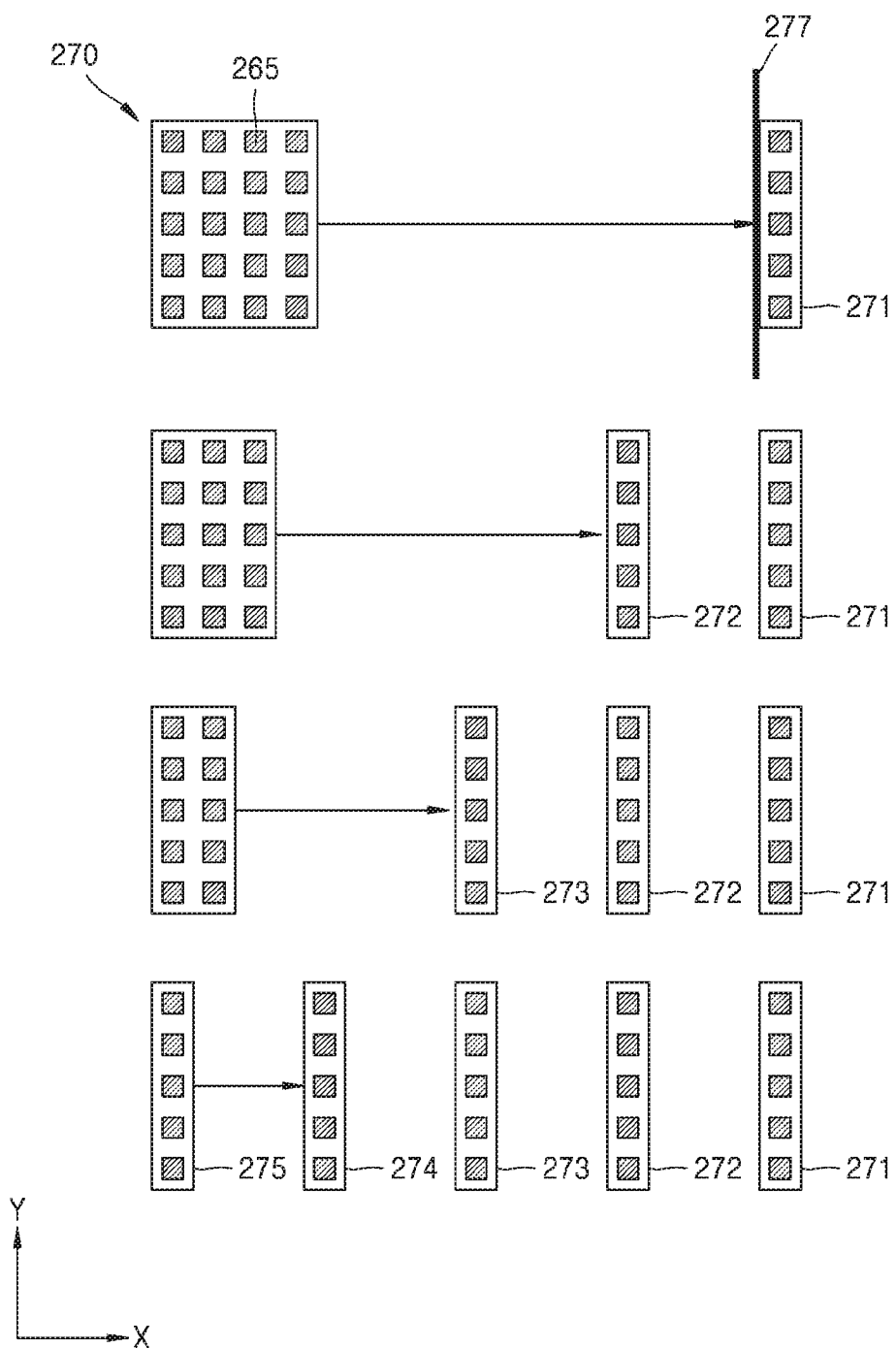

Referring to FIG. 14, in the micro light source array 270, the micro light sources 265 may be arranged in an n×m matrix form. As shown in FIG. 14, the micro light sources 265 may be arranged in a 5×5 matrix form. For ease of illustration, the micro light sources 265 are simply illustrated as having a tetragonal shape.

The micro light source array 270 may include a first column 271, a second column 272, a third column 273, a fourth column 274 and a fifth column 275. The first column 271 of the micro light source array 270 may be separated and transferred in a first direction (for example, an X-axis direction) by using a moving device 277 (i.e., a tool). Here, the first direction may be one direction when the interval between the micro light sources 265 is two-dimensionally adjusted. Next, the second column 272 of the micro light source array 270 may be separated and transferred using the moving device 277. In the same manner, the third column 273, the fourth column 274, and the fifth column 275 may be separated and transferred. The interval (distance) between neighboring columns may be determined according to specifications required by an apparatus to which the micro light source array 270 is applied. As described above, the micro light source array 270 is transferred at once to a target substrate 280 (e.g., base 280 in FIG. 13), and the micro light sources 265 are separated on a column-by-column basis. Therefore, the micro light sources 265 may be efficiently transferred, and the transfer operation time may be reduced. FIG. 14 illustrates a method of one-dimensionally separating the micro light sources 265.

Figure 15:
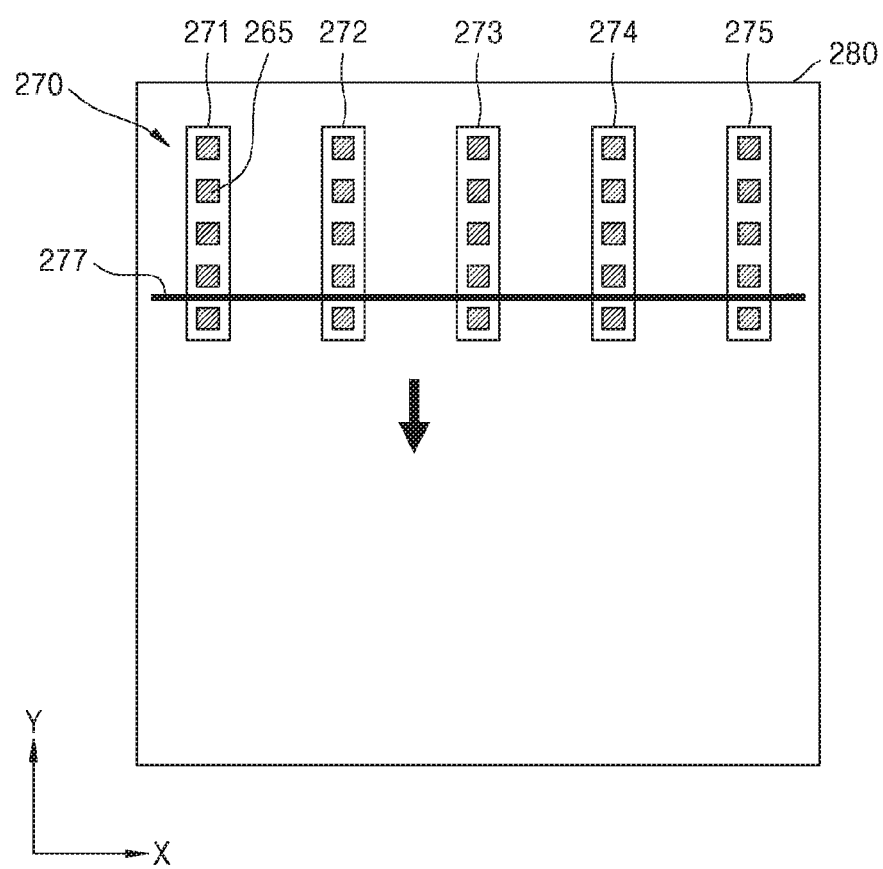

FIG. 15 illustrates a method of two-dimensionally separating the micro light sources 265.

Figure 16:
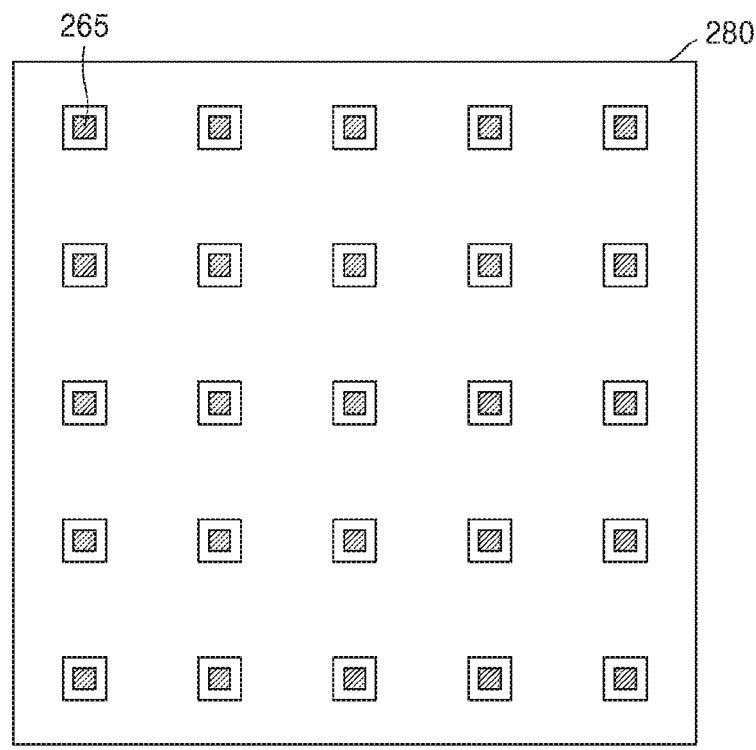

The micro light sources 265 may be separated and transferred from the target substrate 280 in a second direction (for example, a Y-axis direction). Here, the second direction may be another direction different from the first direction when the interval between the micro light sources 265 is two-dimensionally adjusted. The moving device 277 may be used to simultaneously transfer the micro light sources 265 of a first row in the second direction. In the same manner, the micro light sources 265 of second to fifth rows of the micro light sources 265 may be separated and transferred. As a result, the micro light sources 265 may be arranged on the target substrate 280 as shown in FIG. 16.

For example, when implementing a 60 pixel-per-inch (PPI) resolution using LEDs each measuring 100×100 μm², the pitch between adjacent sub-pixels may be approximately 420 μm. Then, when transferring the LED light sources onto the target substrate, 600 PPI may be obtained by adjusting the pitch between LEDs to be about 4.2 times the width of the LEDs. In addition, when implementing 568 PPI resolution using LEDs each measuring 10×10 μm², the pitch between sub-pixels may be approximately 44.8 μm. Then, when transferring LED light sources, 568 PPI may be obtained by adjusting the pitch between LEDs to be about 4.4 times the width of the LEDs.

Figure 17:
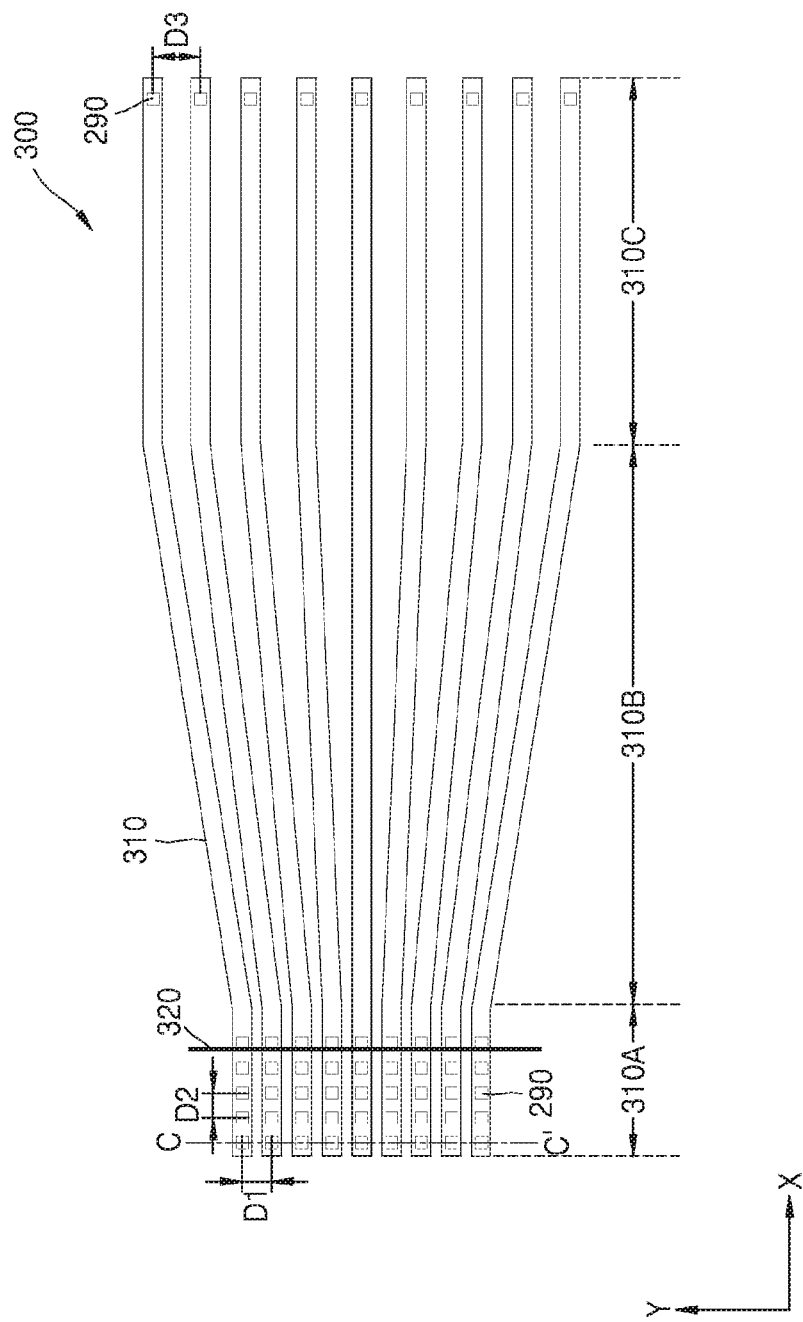
FIGS. 17 to 19 are views illustrating a method of transferring micro light sources according to an example embodiment.
Figure 18:
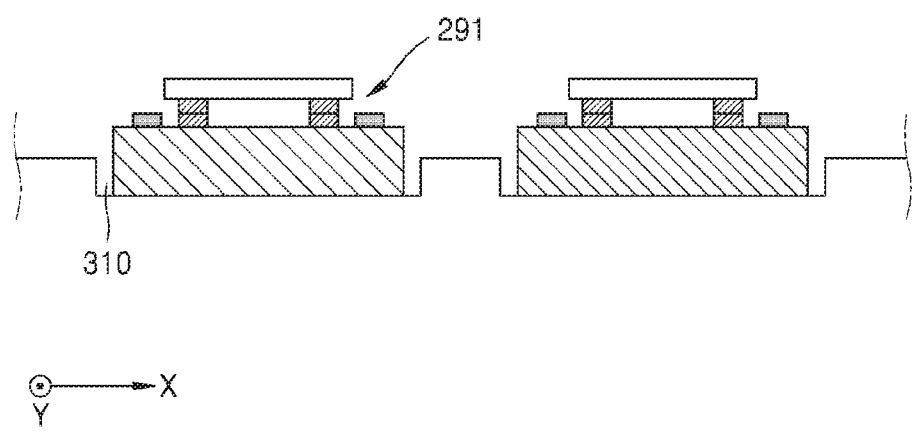

FIG. 17 illustrates an example method of transferring micro light sources. FIG. 18 is a cross-sectional view taken along line C-C of FIG. 17.

Referring to FIG. 17, a micro light source transfer device 300 may include channels 310 through which one-dimensional micro light source arrays 291 each having micro light sources 290 arranged in a row may be moved. The channels 310 may include a first region 310A in which the one-dimensional micro light source arrays 291 are initially arranged, a second region 310B including paths through which the one-dimensional micro light source arrays 291 are transferred and gradually separated, and a third region 310C in which the micro light sources 290 are spread at given intervals.

Referring to FIG. 18, the channels 310 may include grooves through which the micro light sources 290 of the one-dimensional micro light source arrays 291 are guided. The micro light sources 290 of the one-dimensional micro light source arrays 291 may be received in the channels 310 and transferred along the channels 310.

The first region 310A may be a region in which the one-dimensional micro light source arrays 291 are received before the one-dimensional micro light source arrays 291 are transferred. In the first region 310A, the micro light sources 290 may be arranged at first intervals D1 from each other in a first direction (Y-axis direction) and second intervals D2 from each other in a second direction (X-axis direction). The second region 310B may have a reverse-tapered shape that becomes gradually wider with increasing distance from the first region 310A. In the second region 310B, the interval between the channels 310 in the first direction (Y direction) may gradually increase. In the third region 310C, the channels 310 may be separated by a third interval D3 in the first direction (Y direction). The third interval D3 may be greater than the first interval D1. While the one-dimensional micro light source arrays 291 are transferred from the first region 310A to the third region 310C, the interval between the micro light sources 290 may be adjusted from the first interval D1 to the third interval D3.

Figure 19:
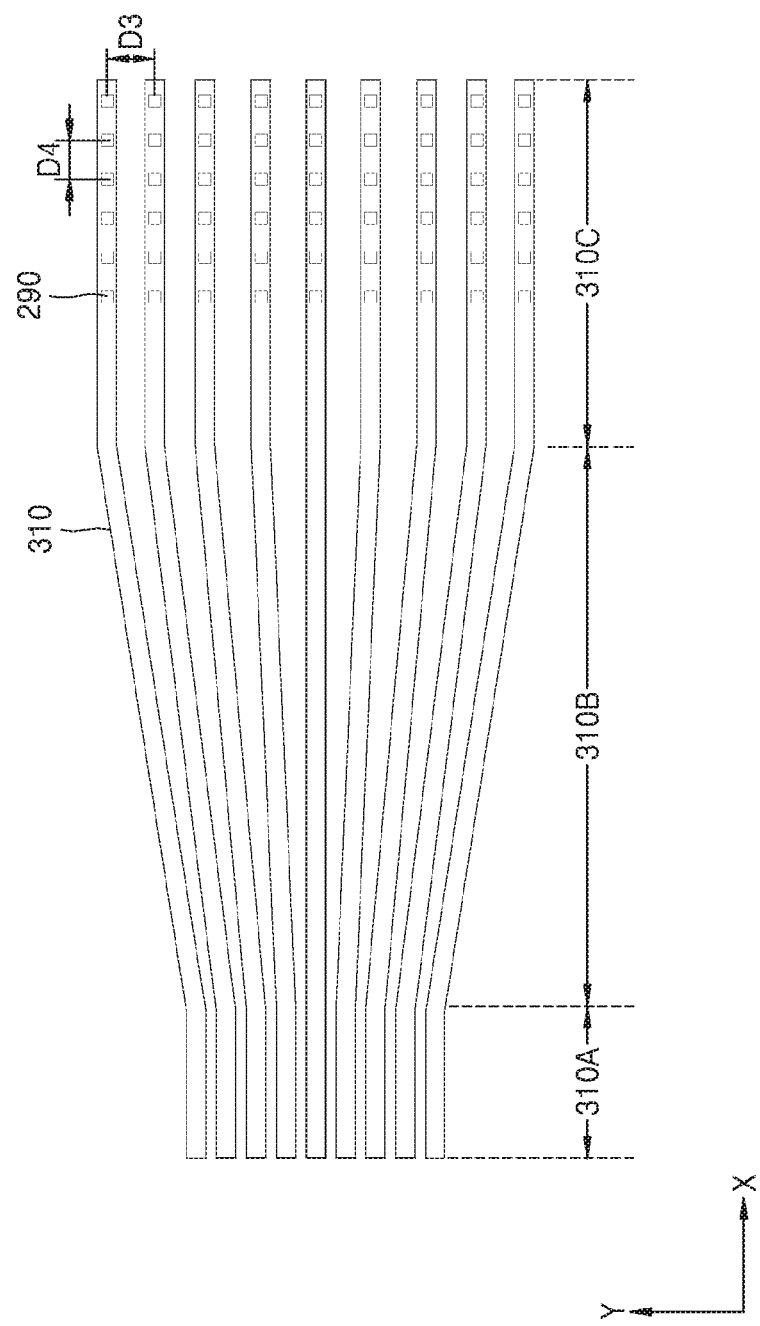

All of the micro light sources 290 included in a one-dimensional micro light source array 291 arranged along a first line in the first direction (Y direction) may be transferred together at the same time along the channels 310 using a moving device 320. As the one-dimensional micro light source array 291 transferred from the first region 310A to the third region 310C, the interval between the micro light sources 290 of the one-dimensional micro light source array 291 may be adjusted to be the third interval D3. Next, all of the micro light sources 290 included in another one-dimensional micro light source array 291 arranged along a second line in the first direction (Y direction) may be transferred together at the same time along the channels 310 using the moving device 320. In this order, the nth micro light source array 291 may be transferred along the channels 310. Referring to FIG. 19, as all the one-dimensional micro light source arrays 291 are transferred from the first region 310A to the third region 310C in this manner, the interval between the micro light sources 290 may be increased from the first interval D1 to the third interval D3 in the first direction (Y direction) and from the second interval D2 to a fourth interval D4 in the second direction (X direction). In other words, the interval between adjacent micro light sources 290 may be adjusted in a two-dimensional manner.

Figure 20:
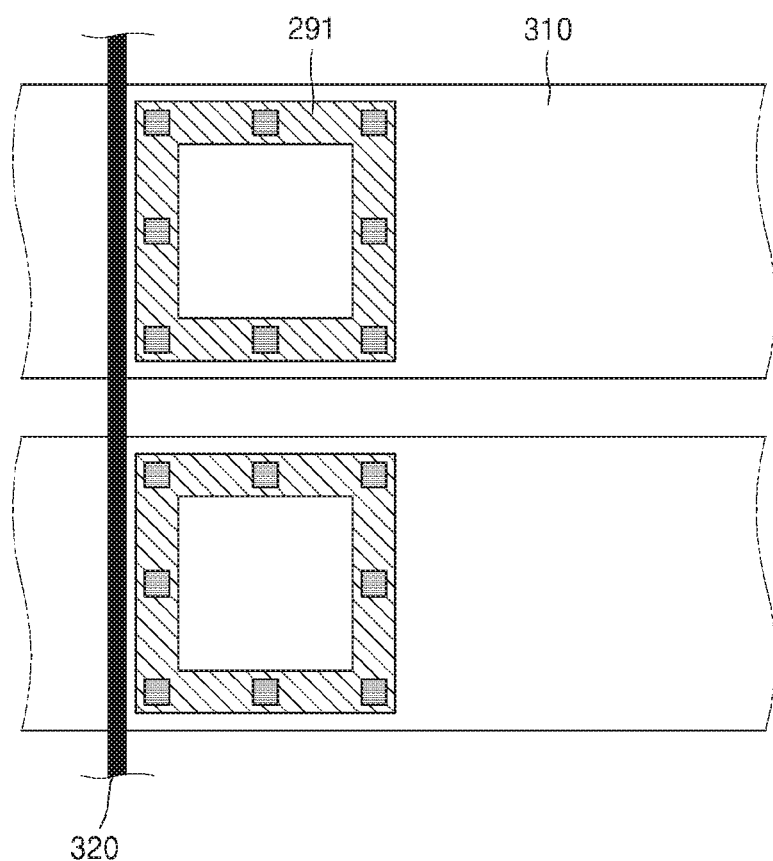
FIGS. 20 and 21 are views illustrating how micro light sources are transferred using a blade in FIG. 17.
Figure 21:
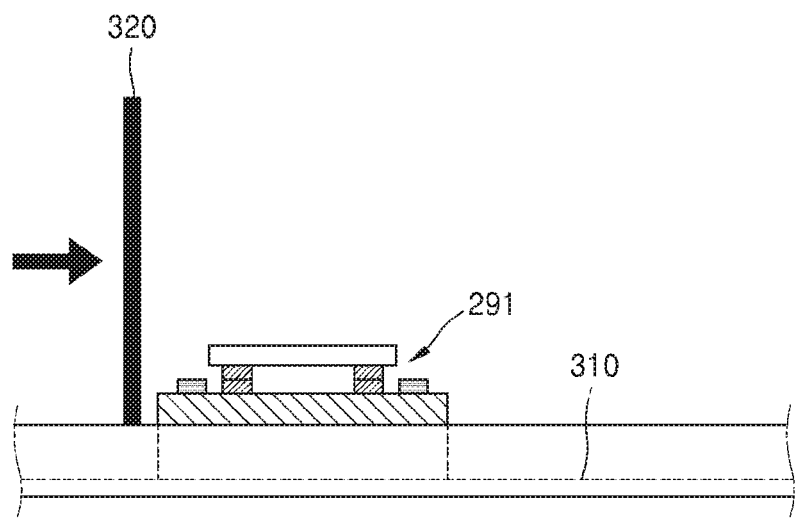

FIGS. 20 and 21 illustrate how a one-dimensional micro light source array 291 is moved by the moving device 320 along the channels 310. The moving device 320 may be a plate capable of sliding the one-dimensional micro light source array 291.

Figure 22:
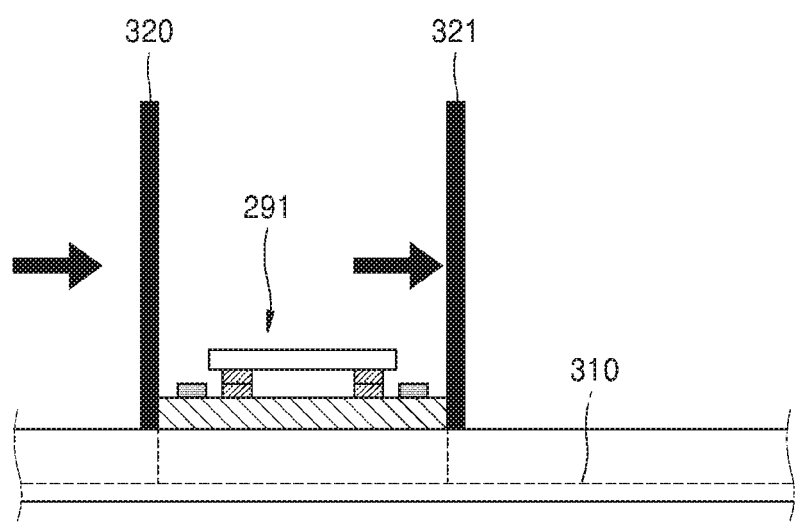
FIG. 22 is a view illustrating how micro light sources are transferred using a pair of blades in FIG. 17.

FIG. 22 illustrates how a one-dimensional micro light source array 291 is transferred using a pair of moving devices 320 and 321.

Figure 23:
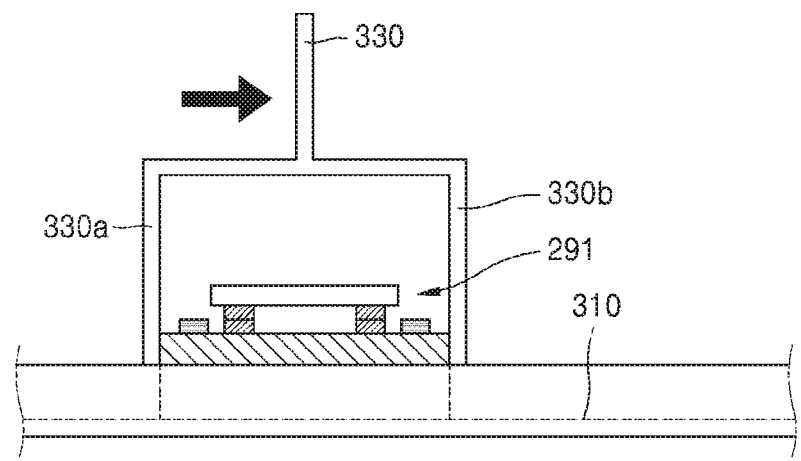
FIG. 23 is a view illustrating how micro light sources are transferred using a holder in FIG. 17.

FIG. 23 illustrates a moving device 330 that may include a first portion 330*a* and a second portion 330*b* to transfer a one-dimensional micro light source array 291 while holding both sides of the one-dimensional micro light source array 291.

Figure 24:
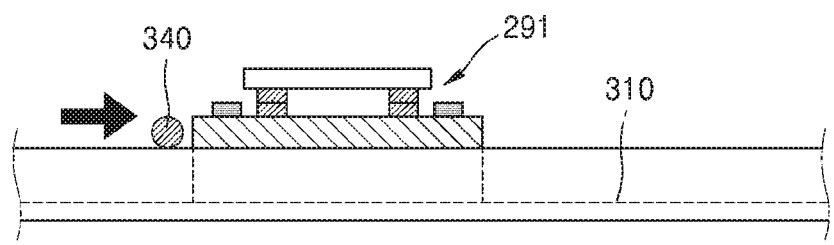
FIG. 24 is a view illustrating how micro light sources are transferred using a wire in FIG. 17.

FIG. 24 illustrates an example in which a moving device 340 is constituted by a wire. The moving device 340 may be brought into contact with a side of micro light sources of a one-dimensional micro light source array 291 to slide the one dimensional micro light source array 291 along the channels 310.

Figure 25:
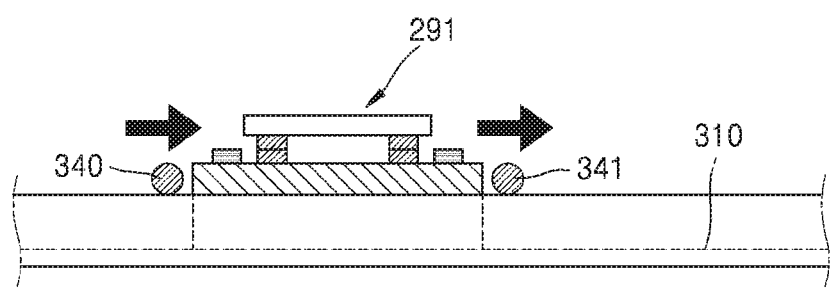
FIG. 25 is a view illustrating how micro light sources are transferred using a pair of wires in FIG. 17.

Referring to FIG. 25, a pair of moving devices 340 and 341 each constituted by a wire may be provided on both sides micro light sources of a one-dimensional micro light source array 291 to transfer the one-dimensional micro light source array 291.

Figure 26:
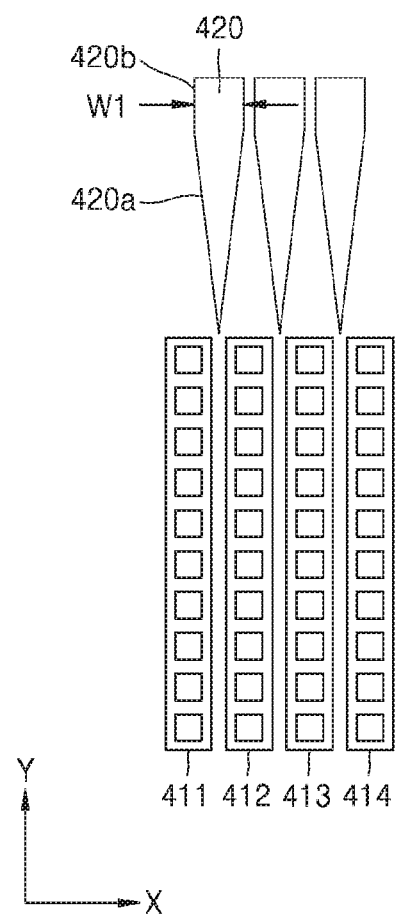
FIGS. 26 to 27 are views illustrating a method of transferring micro light sources according to an example embodiment.

FIG. 26 illustrates moving devices 420 configured to adjust the interval between first, second, third, and fourth micro light source arrays 411, 412, 413, and 414 arranged side by side. The moving devices 420 may have a wedge-shaped structure. The moving devices 420 may include: first portion 420*a* configured to enter between the first, second, third, and fourth micro light source arrays 411, 412, 413, and 414; and second portions 420*b* having a given width W1. The first portions 420*a* are wedge-shaped such that the first portions 420*a* may easily enter between the first, second, third, and fourth micro light source arrays 411, 412, 413, and 414 neighboring each other (i.e., that are adjacent to each other). In addition, since the width of the first portions 420*a* gradually increases, the interval between the first, second, third, and fourth micro light source arrays 411, 412, 413, and 414 may gradually increase as the moving devices 420 are inserted between the first, second, third, and fourth micro light source arrays 411, 412, 413, and 414.

Figure 27:
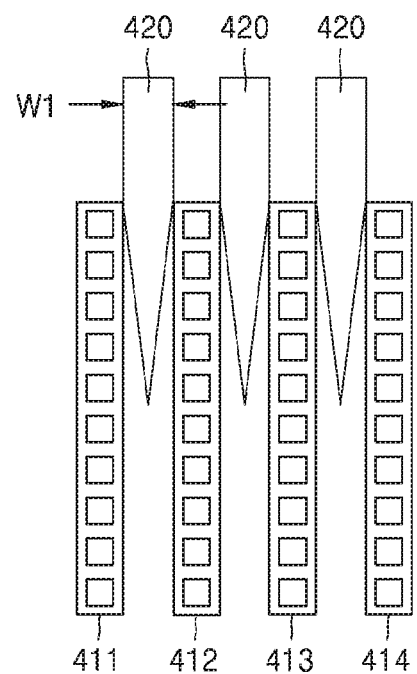

In addition, as shown in FIG. 27, as the second portions 420*b* of the moving devices 420 enter between the first, second, third, and fourth micro light source arrays 411, 412, 413, and 414, the first, second, third, and fourth micro light source arrays 411, 412, 413, and 414 may be spaced apart from each other by a width W1 of the second portions 420*b*. The interval between the first, second, third, and fourth micro light source arrays 411, 412, 413, and 414 may therefore be determined by the width W1 of the second portions 420*b*. As the moving devices 420 simultaneously enter between the first, second, third, and fourth micro light source arrays 411, 412, 413, and 414, the first, second, third, and fourth micro light source arrays 411, 412, 413, and 414 may be arranged with a gap W1 therebetween. In this case, the interval between the first, second, third, and fourth micro light source arrays 411, 412, 413, and 414 may be one-dimensionally adjusted in the X-axis direction (refer to FIG. 26).

Figure 28:
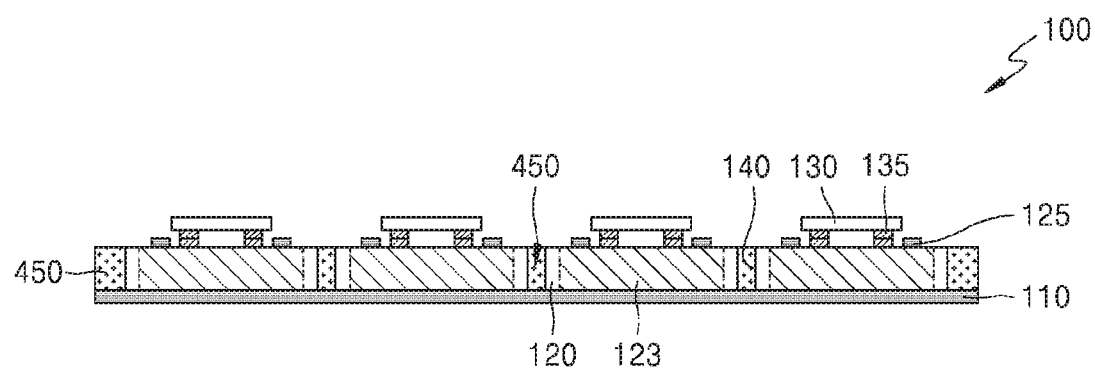
FIG. 28 is a view illustrating a state in which micro light sources are transferred to a target substrate and the target substrate is planarized.

Referring to FIG. 28, after micro light sources of the micro light source arrays are transferred as described above, a film 450 is formed in trenches 140 for planarization of the driving circuits 123. In FIG. 28, substantially the same elements as those shown in FIG. 1 are denoted with the same reference numerals, and thus detailed descriptions thereof will not be presented here.

Figure 29:
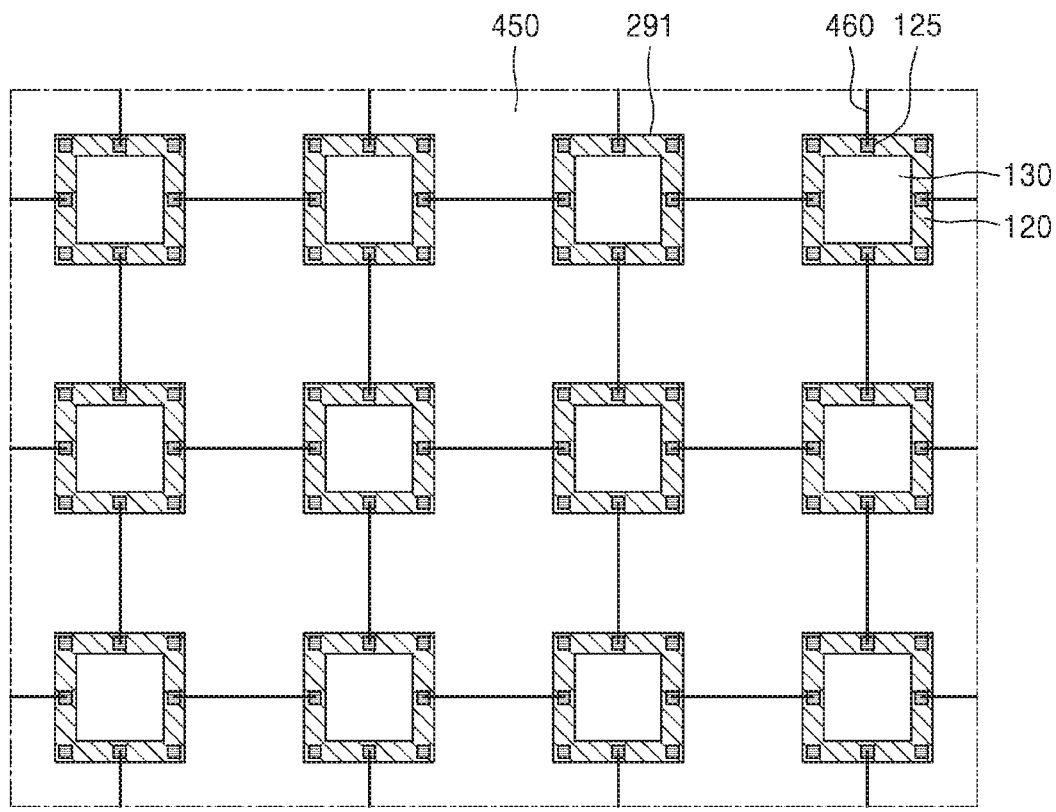
FIG. 29 is a view illustrating the structure shown in FIG. 18 after a wiring process.

Referring to FIG. 29, wiring 460 may be formed on the film 450. The wiring 460 may be connected to contact pads 125 corresponding to the driving circuits.

Figure 30:
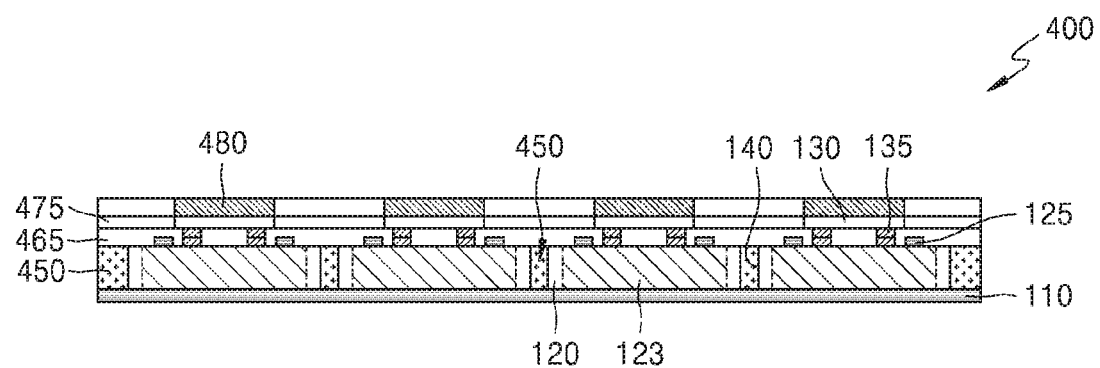
FIG. 30 is a view illustrating a display device according to an example embodiment.

FIG. 30 illustrates a display device 400 according to an example embodiment.

The display device 400 may include first sub-pixels configured to display light having a first color, second sub-pixels configured to display light having a second color, and third sub-pixels configured to display light having a third color. Every first to third sub-pixels may form one pixel. The display device 400 may include silicon sub-mounts 120 provided on a base 110 and respectively corresponding to the sub-pixels, driving circuits 123 provided in the silicon sub-mounts 120, and light emitting device chips 130 coupled to the silicon sub-mounts 120.

Trenches 140 may be provided between the silicon sub-mounts 120 neighboring each other such that the silicon sub-mounts 120 may be spaced apart from each other. The trenches 140 may be formed such that the base 110 may be exposed through the trenches 140. That is, the silicon sub-mounts 120 are separate parts spaced apart from each other by the trenches 140. Each of the driving circuits 123 may include at least one transistor and at least one capacitor to drive the light emitting device chips 130. Each of the driving circuits 123 may include a complementary metal-oxide semiconductor (CMOS) or an n-channel metal-oxide semiconductor (NMOS). In an example embodiment, for example, all the light emitting device chips 130 may be light sources configured to emit blue light. The display device 400 may therefore include color conversion devices 480 configured to convert blue light emitted from the light emitting device chips 130 such that the display device 400 may display multicolor images.

Referring to FIG. 30, at least one layer 465 may be provided on the silicon sub-mounts 120. For example, the at least one layer 465 may be a planarization layer or an insulating layer. The at least one layer 465 may be provided with wiring. In addition, a black matrix film 475 may be provided on the at least one layer 465. The black matrix film 475 may prevent light emitted from each light emitting device chip 130 from entering neighboring sub-pixels. The color conversion devices 480 may be provided in the light emitting device chips 130. For example, the color conversion devices 480 may be quantum dot color filters. The color conversion devices 480 may selectively convert the wavelength of light emitted from the light emitting device chips 130. For example, the light emitting device chips 130 may emit blue light. The color conversion devices 480 may then convert the blue light emitted from the light emitting device chips 130 into red light or green light. For example, when the color conversion devices 480 are quantum dot color filters, quantum dots may be particles each having equal to or more than hundreds to thousands of atoms and may be synthesized in the form of semiconductor crystals having a nanometer size (nm). For example, the quantum dots may include a group II-VI, III-V, IV-VI, or IV semiconductor compound, or a mixture thereof. For example, the quantum dots may include one selected from the group consisting of CdS, CdSe, CdTe, ZnS, ZnSe, ZnTe, InP, InAs, or a mixture thereof. When light is incident on the quantum dots, the quantum dots may emit various colors depending on the sizes of the quantum dots. Thus, blue light emitted from the light emitting device chips 130 may pass through the quantum dots without change or may be changed to green light or red light. Thus, a multicolor image may be displayed.

Figure 31:
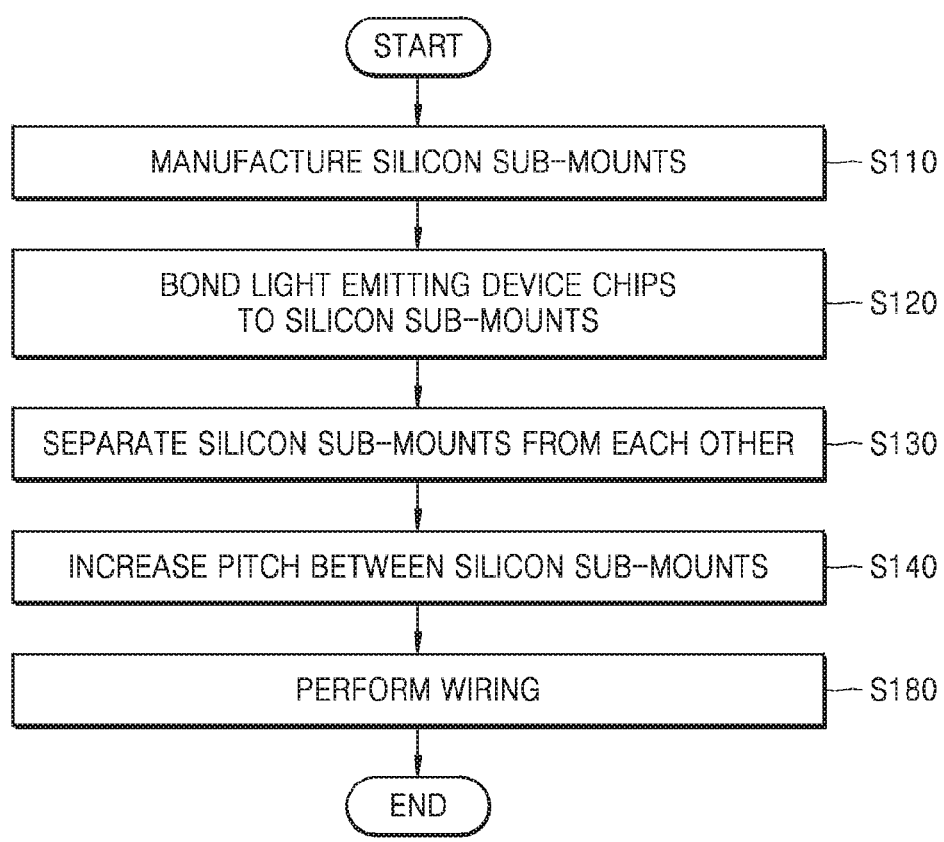
FIG. 31 is a view illustrating a method of manufacturing a display device according to an example embodiment.

FIG. 31 illustrates a method of manufacturing a display device according to an example embodiment. The manufacturing method includes manufacturing silicon sub-mounts (S110). The silicon sub-mounts may be manufactured according to the method described with reference to FIGS. 3-5. Thereafter, light emitting device chips may be bonded to the silicon sub-mounts (S120). Thereafter, the silicon sub-mounts to which the light emitting device chips are bonded may be separated from each other (S130). Then, the separated silicon sub-mounts may be transferred to a target substrate while increasing the pitch between the silicon sub-mounts (S140). When, for example, a data line, a scan line, a positive supply voltage (VDD), and the like may be printed on the target substrate wiring may be performed to electrically connect the silicon sub-mounts and the light emitting device chips to each other (S180) using the data line, the scan line, the VDD, or the like.

Figure 32:
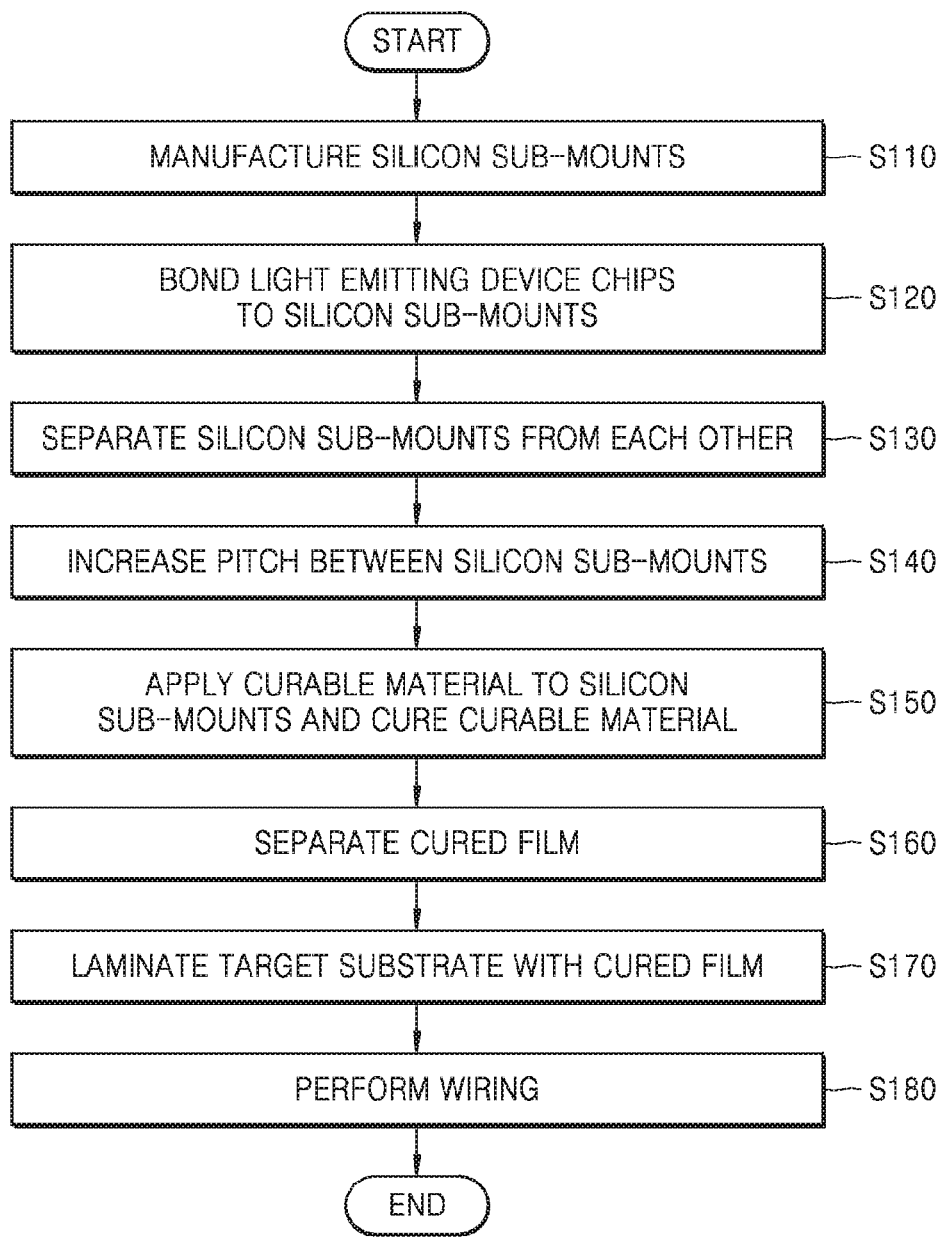
FIG. 32 is a view illustrating a method of manufacturing a display device according to an example embodiment.

FIG. 32 illustrates a method of manufacturing a display device according to an example embodiment. Compared to the method shown in FIG. 31, the method shown in FIG. 32 may further include several operations between operations S140 and S180. Silicon sub-mounts may be transferred to a temporary substrate while increasing the pitch between the silicon sub-mounts (S140). Then, a curable material may be applied to the silicon sub-mounts and cured to a film for fixing the increased pitch (S150). The cured film is separated from the temporary substrate (S160). The silicon sub-mounts and light emitting device chips are then arranged on the cured film. A target substrate is laminated with the cured film (S170). Next, wiring is performed to electrically connect the silicon sub-mounts with each other (S180). The wiring may be performed by, for example, a screen printing method, an inkjet printing method, or the like. In this manner, an active matrix array in which two-dimensional pixels are electrically connected may be provided.

It should be understood that the example embodiments described herein should be considered in a descriptive sense only and not for purposes of limitation. Descriptions of features or aspects within each example embodiment should typically be considered as available for other similar features or aspects in other example embodiments.

While example embodiments have been described with reference to the figures, it will be understood by those of ordinary skill in the art that various changes in form and details may be made therein without departing from the spirit and scope as defined by the following claims.

What is claimed is:

1. A display device comprising:
 a substrate;
 a plurality of silicon sub-mounts provided on the substrate, each silicon sub-mount from among the plurality of silicon sub-mounts corresponding to a respective sub-pixel from among a plurality of sub-pixels of the display device, the plurality of silicon sub-mounts being separated from each other by a plurality of trenches;
 a plurality of light emitting device chips coupled to the plurality of silicon sub-mounts;
 a plurality of driving circuits provided at the plurality of silicon sub-mounts; and
 a plurality of color conversion devices provided on the plurality of light emitting device chips, the plurality of color conversion devices being configured to convert a color of light emitted from the plurality of light emitting device chips.

2. The display device of claim 1, wherein each driving circuit from among the plurality of driving circuits comprises a complementary metal-oxide semiconductor (CMOS) or an n-channel metal-oxide semiconductor (NMOS).

3. The display device of claim 1, wherein the plurality of light emitting device chips are flip-chip bonded to the plurality of silicon sub-mounts.

4. The display device of claim 1, wherein a pitch between adjacent silicon sub-mounts from among the plurality of silicon sub-mounts in each of a first direction and a second direction perpendicular to the first direction is equal to a pitch between adjacent sub-pixels from among the plurality of sub-pixels.

5. The display device of claim 1, wherein each light emitting device chip from among the plurality of light emitting device chips micro LED.

6. The display device of claim 1, wherein the plurality of light emitting device chips are configured to emit blue light.

* * * * *